US007099223B2

(12) United States Patent
Do

(10) Patent No.: US 7,099,223 B2
(45) Date of Patent: Aug. 29, 2006

(54) SEMICONDUCTOR MEMORY DEVICE

(75) Inventor: Chang-Ho Do, Kyoungki-do (KR)

(73) Assignee: Hynix Semiconductor, Inc., (KR)

( * ) Notice: Subject to any disclaimer, the term of this patent is extended or adjusted under 35 U.S.C. 154(b) by 0 days.

(21) Appl. No.: 11/148,789

(22) Filed: Jun. 8, 2005

(65) Prior Publication Data

US 2006/0140018 A1     Jun. 29, 2006

(30) Foreign Application Priority Data

Dec. 28, 2004  (KR)  ...................... 10-2004-0113621

(51) Int. Cl.
*G11C 5/14* (2006.01)
(52) U.S. Cl. ................................. 365/226; 365/189.09
(58) Field of Classification Search ................ 365/226, 365/189.09, 227, 229
See application file for complete search history.

(56) References Cited

U.S. PATENT DOCUMENTS 6,370,075 B1 * 4/2002 Haeberli et al. ............ 365/226
6,414,881 B1 * 7/2002 Fujii et al. ............. 365/189.09
6,472,926 B1 * 10/2002 Taito et al. .................. 327/536
2003/0151945 A1 * 8/2003 Tanzawa ................ 365/185.01

* cited by examiner

*Primary Examiner*—Anh Phung
(74) *Attorney, Agent, or Firm*—Blakely Sokoloff Taylor & Zafman

(57) ABSTRACT

The present invention is related to an internal voltage generator for use in a semiconductor memory device preventing latch-up and chip damage. The internal voltage generator includes a first pumping block for comparing an internal upper voltage with a reference voltage to generate a first compensated upper voltage based on a comparison result, an initial level sensor for comparing the internal upper voltage with an operating voltage to thereby generate a first enable signal, a second pumping block for generating a second compensated upper voltage in response to an active command, the first enable signal, and the comparison result of the first pumping block, and an initializing block for providing the internal voltage during an initial operation of the semiconductor memory device.

15 Claims, 7 Drawing Sheets

SEMICONDUCTOR MEMORY DEVICE

FIELD OF INVENTION

The present invention relates to a semiconductor memory device; and, more particularly, to an internal voltage generator preventing a latch-up and a chip damage caused by unstable operating current.

DESCRIPTION OF PRIOR ART

Generally, a semiconductor memory device internally generates a voltage used by itself. An internal voltage generator in the semiconductor memory device is used for receiving an external voltage VDD to thereby generate an internal voltage having controllable voltage level.

For increasing operation reliability of the semiconductor memory device, it is required to reliably generate the internal voltage having a predetermined constant level regardless of changes of temperature, process and pressure.

Without any device controlling level of the internal voltage, an unexpected turn-on of P-N junction occurs to p-type semiconductors and n-type semiconductors included in the semiconductor memory device; and, due to the unexpected turn-on, the semiconductor memory device can get deadly damaged.

FIG. 1 is a block diagram showing a conventional internal voltage generator.

As shown, the internal voltage generator is provided with a level sensor 10, a first oscillation signal generator 20, a stand-by charge pump 30, an enable signal generator 40, a second oscillation signal generator 50, and an active charge pump 60.

The level sensor 10 is for sensing a level of an upper voltage VPP corresponding to a reference voltage VREF_PP. The first oscillation signal generator 20 generates a first oscillation signal tOSC_S in response to an output signal PPE from the level sensor 10. The stand-by charge pump 30 generates the upper voltage VPP by pumping a power supply voltage VDD in response to the first oscillation signal tOSC_S outputted from the first oscillation signal generator 20. The enable signal generator 40 receives the output signal PPE from the level sensor 10 and generates an active operation signal PPE_A. The second oscillation signal generator 50 generates a second oscillation signal tOSC_A in response to the active operation signal PPE_A. The active charge pump 60 receives the second oscillation signal tOSC_A to generate the upper voltage VPP by pumping the power supply voltage VDD.

Further, the enable signal generator 40 includes a command generator 42 and an output controller 44. The command generator 42 receives an active signal ACT to thereby generate an internal active signal ACT_EN. The output controller 44 converts the active signal ACT_EN into the active operation signal PPE_A.

Meanwhile, the charge pumps 30 and 60 do not operate until the power supply voltage VDD is increased to a predetermined level. Therefore, the internal voltage generator further includes an initializing block 70 for generating the upper voltage VPP while the charge pumps 30 and 60 do not operate.

In an aforementioned embodiment of the conventional art, the oscillation signal generator 20 and 50 is controlled by one level sensor 10. Also, two level sensors can be provided in the semiconductor memory device in accordance with another embodiment, wherein one is used in active state and the other is used in stand-by state.

Hereinafter, the operation of the internal voltage generator is explained.

First of all, in a stand-by state which the active signal ACT is not activate, the level sensor 10 activates the output signal PPE when the upper voltage VPP is lower than the reference voltage VREF_PP. Then, the first oscillation signal generator 20 is activated in response to the output signal PPE from the level sensor 10 and generates the first oscillation signal tOSC_S. The stand-by charge pump 30 provides the upper voltage VPP by pumping the power supply voltage VDD in response to the first oscillation signal tOSC_S and makes the level of the upper voltage VPP to hold a predetermined value.

Also, in an active state, the enable signal generator 40 is activated in response to the active command ACT for converting the internal active signal ACT_EN into the active operation signal PPE_A in response to the output signal PPE from the level sensor 10.

Accordingly, after the level sensor 10 outputs the output signal PPE, the oscillation signal generators 20 and 50 generates the oscillation signals tOSC_S and tOSC_A, respectively. Then, the charge pumps 30 and 60 provide the upper voltage VPP by pumping the power supply voltage VDD in response to the oscillation signals tOSC_S and tOSC_A, respectively.

As above mentioned, the internal voltage generator keeps the level of the upper voltage VPP holding a predetermined value by sensing the level of the upper voltage VPP and operating the charge pumps 30 and 60.

In the stand-by state consuming less current, the internal voltage generator provides the upper voltage VPP only through the stand-by charge pump 30 consuming small operating power. Meanwhile, since the active command ACT is activated when large amount of current is consumed in the semiconductor memory device, the internal voltage generator makes the active charge pump 60 consuming large operating power additionally operate as well as the stand-by charge pump 30 in order to provide the upper voltage VPP.

Hereinafter, the operation of the semiconductor memory device supplied with the upper voltage VPP generated by the aforementioned internal voltage generator is explained.

FIG. 2A is a cross-sectional diagram of an inverter implemented with general CMOS transistor. FIG. 2B is a schematic diagram showing a parasitic transistor in the inverter shown in FIG. 2A.

As shown in FIG. 2A, the upper voltage VPP, which is higher than the power supply voltage VDD applied to a source terminal of the PMOS transistor PM1, is supplied to a substrate of a PMOS transistor PM1 in the inverter. Further, a negative voltage VBB, which is lower than the ground voltage VSS applied to a source terminal of a NMOS transistor NM1, is supplied to a substrate of the NMOS transistor NM1.

The reason, why the voltage supplied to the substrate of the MOS transistor is different from the voltage supplied to the source terminal of the MOS transistor, is for improving the performance and minimizing a size of the semiconductor memory device.

When the substrate and the source terminal of the MOS transistor are respectively supplied with different voltage levels, a BJT parasitic transistor is made in a form that collectors of each transistors are connected to corresponding bases of each other transistors as shown in FIG. 2B.

Meanwhile, the upper voltage VPP supplied to the substrate of the PMOS transistor PM1 is generated from the power supply voltage VDD supplied to the source terminal of the PMOS transistor PM1 by the internal voltage generator shown in FIG. 1.

However, the conventional internal voltage generator provides the upper voltage VPP through the level sensor 10, the first and second oscillation signal generators 20 and 50, and the stand-by and the active charge pump 30 and 60.

Accordingly, during an initial operation of the semiconductor memory device, a level of the upper voltage VPP is not increased proportionally when the power supply voltage VDD is raised.

Hereinafter, it is described that a level change of the upper voltage VPP based on a level change of the power supply voltage VDD referring to FIGS. 3A and 3B.

FIG. 3A is a graph showing the level change of the upper voltage VPP in response to an increase of the power supply voltage VDD level, wherein an X-axis refers to time and a Y-axis refers to a voltage level.

FIG. 3B is a graph showing the level change of the upper voltage VPP when the level of the power supply voltage VDD is more rapidly boosted up, as compared with FIG. 3A.

Comparing FIG. 3A with FIG. 3B, the level of the upper voltage VPP according to the case of FIG. 3B, i.e., when the level of the power supply voltage VDD is raised more rapidly, has much lower voltage than the level of the power supply voltage VDD, initially. In other words, the difference of voltage level between the upper voltage VPP and the power supply voltage VDD in case of FIG. 3B is much larger than that in case of FIG. 3A; and a section where the upper voltage VPP is lower than the power supply voltage VDD in case of FIG. 3B is longer than that in case of FIG. 3A.

As above mentioned, because of the delay amount for the operation of the internal voltage generator, the upper voltage VPP is not raised in proportion to the increase of the power supply voltage VDD; and, accordingly, is lower than the level of the power supply voltage for a predetermined time.

Further, as above mentioned, as the power supply voltage VDD is raised more rapidly, the voltage difference between the upper voltage VPP and the power supply voltage VDD becomes larger; and a time that the upper voltage VPP is lower than the power supply voltage VDD becomes longer.

Meanwhile, a P-N junction is turned on in a forward direction if the level of the upper voltage VPP is lower than the level of the power supply voltage VDD and the difference between the upper voltage and the power supply voltage is larger than a threshold voltage of P-type junction and N-type junction of the BJT parasitic transistor.

Therefore, an excessive current can flow both from the source terminal of the PMOS transistor to the substrate of the NMOS transistor and from the substrate of the PMOS transistor to the source terminal of the NMOS transistor, and this is a latch-up phenomenon. If the latch-up phenomenon is continued, there exists possibility for the chip to be crashed.

In order to prevent the latch-up phenomenon, the upper voltage VPP is raised in proportional to a rate of rising of the power supply voltage. Therefore, the internal voltage generator has to improve its charge transmitting ability by expanding a size of the stand-by charge pump 20 or improving a driving strength of the initializing block 70.

However, in case of expanding the size of a pump or improving the driving strength of the initializing block, a total size of the chip is increased.

Further, in case of expanding the size of the stand-by charge pump 20, an excessive amount of current can flow in the semiconductor memory device through the level of the power supply voltage VDD is stabilized.

SUMMARY OF INVENTION

It is, therefore, an object of the present invention to provide an internal voltage generator for preventing latch-up phenomenon and chip damage because of excessive current flowed in a semiconductor memory device.

In accordance with an aspect of the present invention, there is provided an internal voltage generator including a level sensing device for comparing a level of an internal voltage with a reference voltage; a first oscillation signal generating device for generating a first oscillation signal in response to an output signal of the level sensing device; a first charge pumping device for generating the internal voltage by receiving the first oscillation signal and pumping an external voltage; an initial level sensing device for comparing the level of the internal voltage with the external voltage; an enable signal generating device for generating an active enable signal in response to an active command, the output signal of the level sensing device, and an output signal of the initial level sensing device; a second oscillation signal generating device for generating a second oscillation signal in response to the active enable signal; a second charge pumping device for generating the internal voltage by receiving the second oscillation signal and pumping the external voltage; and an initializing device for providing the internal voltage during an initial operation of the semiconductor memory device.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, an internal voltage generator in accordance with the present invention will be described in detail referring to the accompanying drawings.

Figure 4:
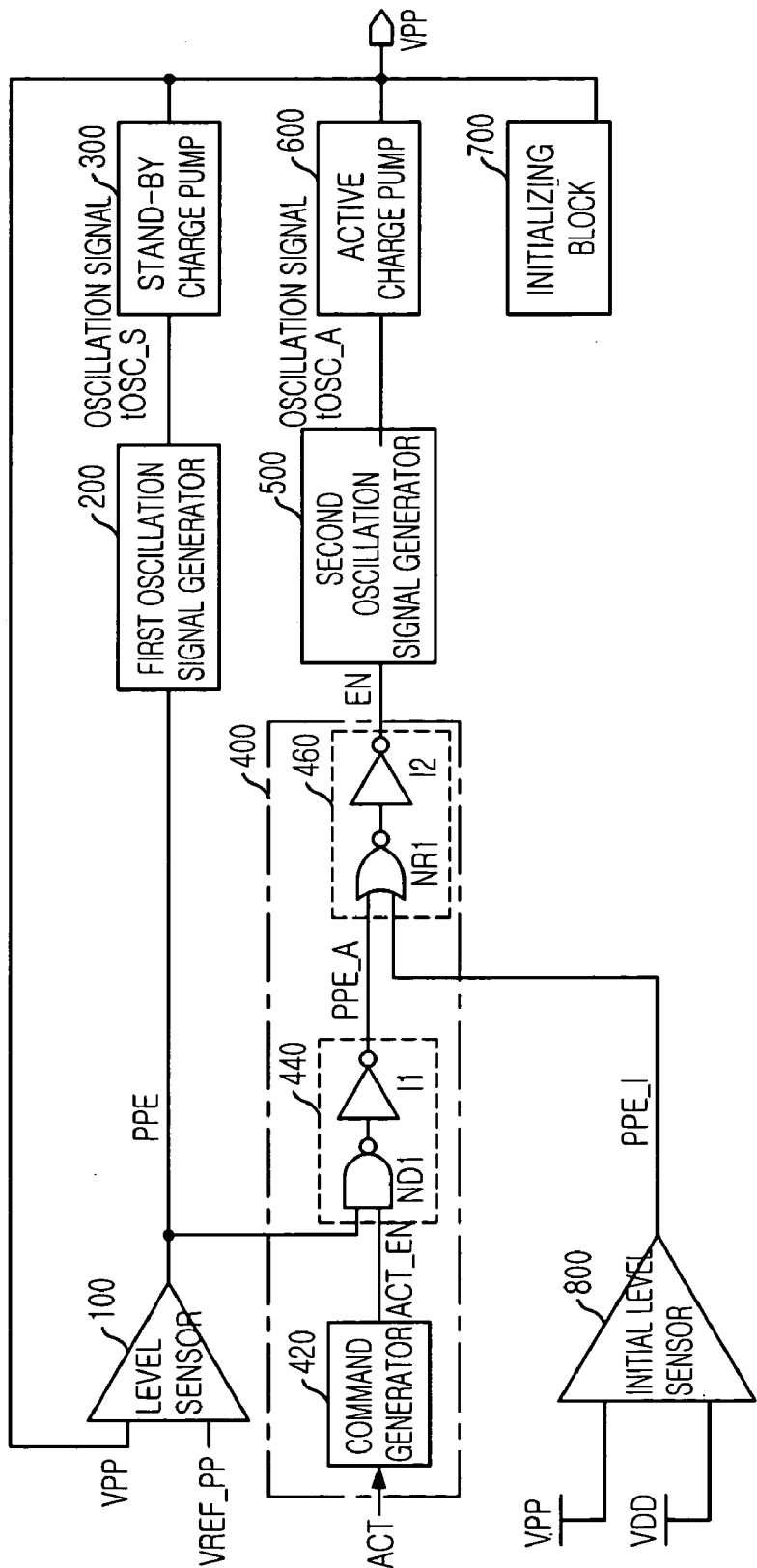
FIG. 4 is a block diagram showing an internal voltage generator in accordance with a preferred embodiment of the present invention.

FIG. 4 is a block diagram showing the internal voltage generator in accordance with a preferred embodiment of the present invention.

Referring to FIG. 4, the internal voltage generator is provided with a level sensor 100, a first oscillation signal generator 200, a stand-by charge pump 300, an initial level sensor 800, an enable signal generator 400, a second oscillation signal generator 500, an active charge pump 600, and an initializing block 700.

The level sensor 100 senses a level of an upper voltage VPP corresponding to a reference voltage VREF_PP. The first oscillation signal generator 200 generates a first oscillation signal tOSC_S in response to an output signal PPE from the level sensor 100. The stand-by charge pump 300 receives the first oscillation signal tOSC_S outputted from the first oscillation signal generator 200 and generates the upper voltage VPP by pumping a power supply voltage VDD.

The initial level sensor 800 is for sensing the level of the upper voltage VPP corresponding to the power supply voltage VDD. The enable signal generator 400 generates an active enable signal EN in response to the output signal PPE outputted from the level sensor 100 when an active command ACT is applied to the enable signal generator 400 or in response to an initial level signal PPE_I from the initial level sensor 800. The second oscillation generator 500 is for generating a second oscillation signal tOSC_A in response to the active enable signal EN. The active charge pump 600 receives the second oscillation signal tOSC_A outputted from the second oscillation signal generator 500 and generates the upper voltage VPP by pumping the power supply voltage VDD. Lastly, the initializing block 700 is for generating the upper voltage VPP in an initial operation of the semiconductor memory device.

Further, the enable signal generator 400 is provided with a command generator 420, a first output controller 440, and a second output controller 460. The command generator 420 receives the active command ACT and generates an internal active signal ACT_EN. The first output controller 440 outputs an intermediate active signal PPE_A when the output signal PPE from the level sensor 100 is activated. The second output controller 460 is for activating the active enable signal EN when the intermediate active signal PPE_A outputted from the first output controller 440 or the initial level signal PPE_I outputted from the initial level sensor 800 is activated.

The internal voltage generator in accordance with the preferred embodiment includes the initial level sensor 800 which is not included in the conventional internal voltage generator. Therefore, the operation of the initial level sensor 800 is explained hereinafter.

First of all, when the level of the upper voltage 800 is lower than the power supply voltage VDD, the initial level sensor 800 activates the initial level signal PPE_I, then the enable signal generator 400 activates the active enable signal EN in response to the initial level signal PPE_I.

Subsequently, the second oscillation signal generator 500 is activated by the active enable signal EN and generates the second oscillation signal tOSC_A, then the active charge pump 600 provides the upper voltage VPP by pumping the power supply voltage VDD in response to the second oscillation signal tOSC_A outputted from the second oscillation signal generator 500.

Also, the initializing block 700 provides the upper voltage VPP when the upper voltage VPP is lower than the power supply voltage VDD, e.g., during the initial operation of the semiconductor memory device.

In other words, the internal voltage generator in accordance with the present invention additionally includes the initial level sensor 800 to control the second oscillation signal generator 500, the active charge pump 600, and the initializing block 700 together for providing the upper voltage VPP, when the level of the upper voltage VPP is lower than the level of the power supply voltage VDD.

Figure 5A:
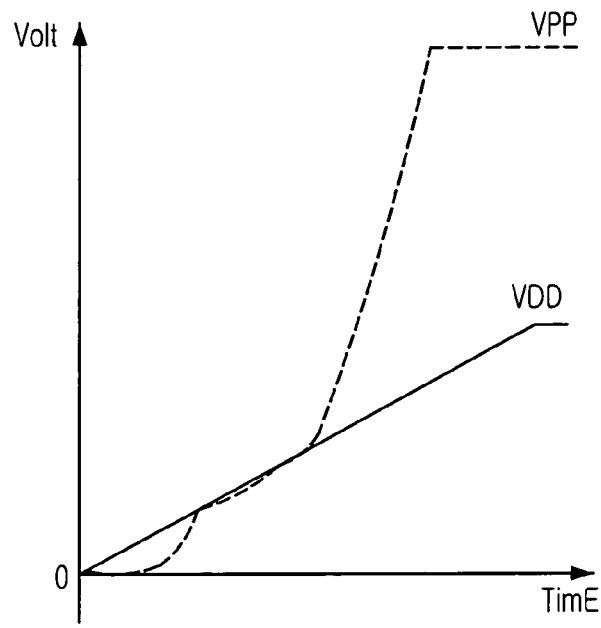
FIG. 5A is a diagram showing a level change of the upper voltage VPP in response to a change of the power supply voltage VDD, wherein an X-axis refers time and a Y-axis refers voltage level.

FIG. 5A is a diagram showing a level change of the upper voltage VPP in response to a change of the power supply voltage VDD, wherein an X-axis refers time and a Y-axis refers voltage level.

Figure 5B:
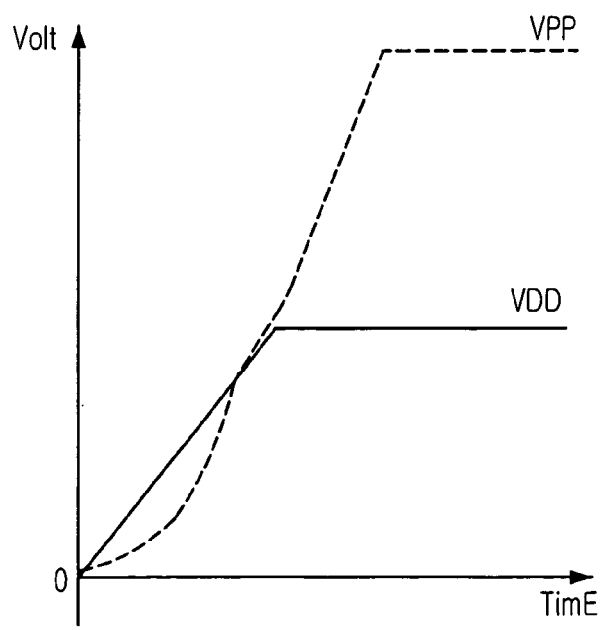
FIG. 5B is a diagram showing the level change of the upper voltage VPP when the level of the power supply voltage VDD is more rapidly raised than FIG. 5A.

FIG. 5B is a diagram showing the level change of the upper voltage VPP when the level of the power supply voltage VDD is more rapidly raised than FIG. 5A.

Figure 1:
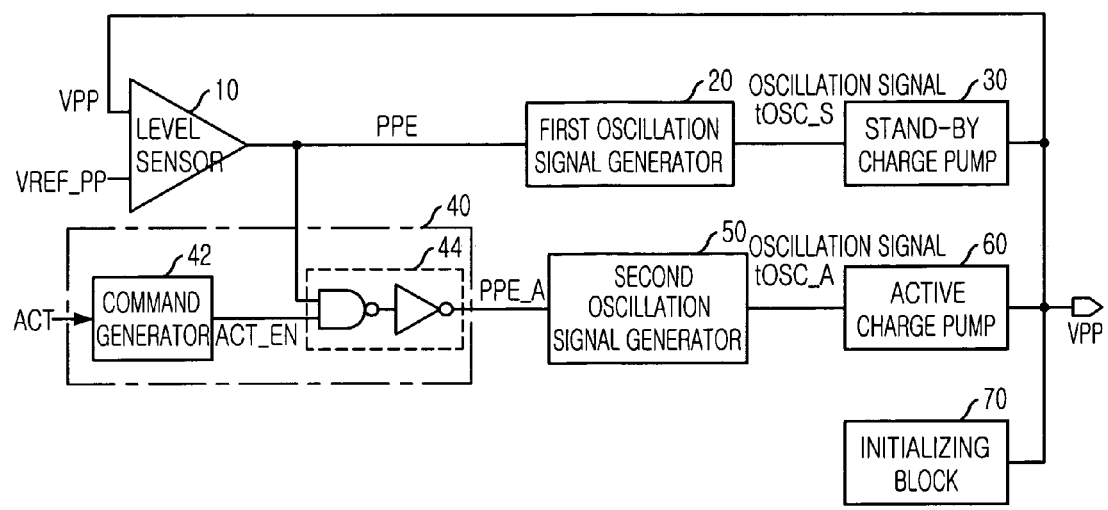
FIG. 1 is a block diagram showing a conventional internal voltage generator.
Figure 2A:
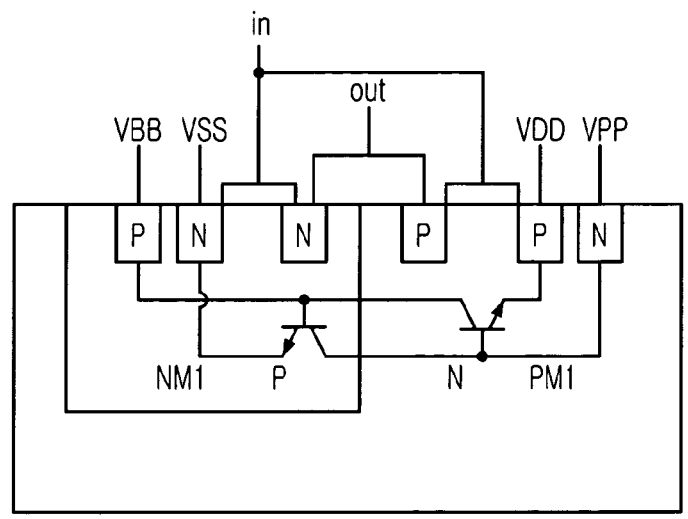
FIG. 2A is a cross-sectional diagram of an inverter implemented with general CMOS transistor.
Figure 2B:
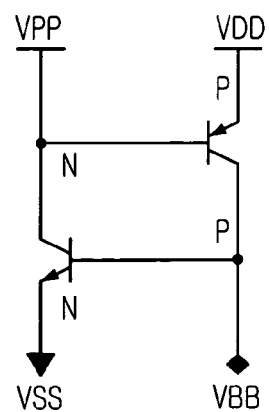
FIG. 2B is a schematic diagram showing a parasitic transistor in the inverter shown in FIG. 2A.
Figure 3A:
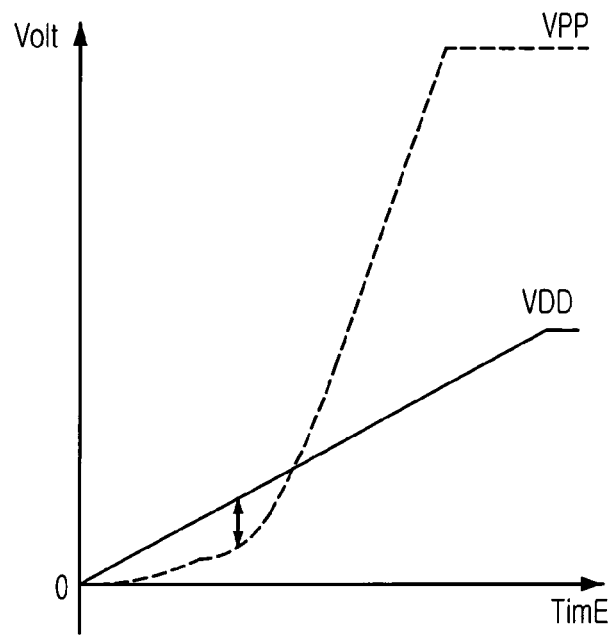
FIG. 3A is a diagram showing the level change of the upper voltage VPP in accordance with a raise of the power supply voltage VDD level, wherein an X-axis refers time and a Y-axis refers voltage level.

Comparing FIG. 5A with FIG. 3A, the upper voltage VPP level generated by the internal voltage generator in accordance with the present invention is more rapidly raised in response to the rising of the power supply voltage VDD than the upper voltage VPP level of the conventional internal voltage generator.

Figure 3B:
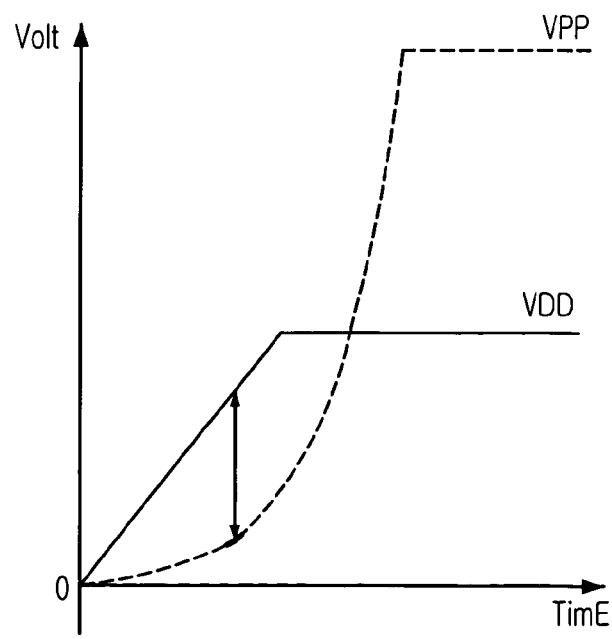
FIG. 3B is a diagram showing the level change of the upper voltage VPP when the level of the power supply voltage VDD is more rapidly raised than FIG. 3A.

Further, comparing FIG. 5B with FIG. 3B, when the power supply voltage VDD is raised rapidly, the level of the upper voltage VPP in accordance with the present invention is raised more rapidly than the upper voltage VPP of conventional art. Also, the difference between the upper voltage VPP and the power supply voltage VDD in FIG. 5B is much smaller than that in FIG. 3B.

As above mentioned, the internal voltage generator of the present invention additionally provides the upper voltage VPP through the active charge pump 600 and accordingly responses to the rising of the power supply voltage VDD level more rapidly, when the level of the upper voltage VPP is lower than the level of the power supply voltage VDD.

Figure 6A:
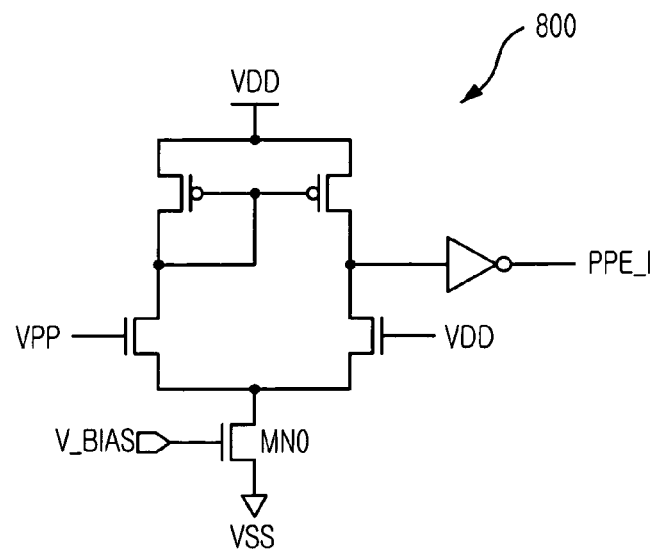
FIG. 6A is a schematic circuit diagram depicting initial level sensor shown in FIG. 4 in accordance with a first embodiment of the present invention.

FIG. 6A is a schematic circuit diagram of the initial level sensor 800 shown in FIG. 4 in accordance with a first embodiment.

Referring to FIG. 6A, the initial level sensor 800 is implemented with a differential sensor amplifier having the upper voltage VPP and the power supply voltage VDD as differential inputs and being for outputting the initial level signal PPE_I in case that the upper voltage VPP is lower than the power supply voltage VDD.

In case that the upper voltage VPP is lower than the power supply voltage VDD, the initial level sensor 800 activates the initial level signal PPE_I to a logic level 'H'; and in case that the upper voltage VPP is higher than the power supply voltage VDD, the initial level sensor 800 inactivates the initial level signal PPE_I to a logic level 'L'.

Further, for a reliable operation of the initial level sensor 800, the inputs supplied to the differential amplifier are divided voltage rather the direct upper voltage VPP and the direct power supply voltage VDD.

Figure 6B:
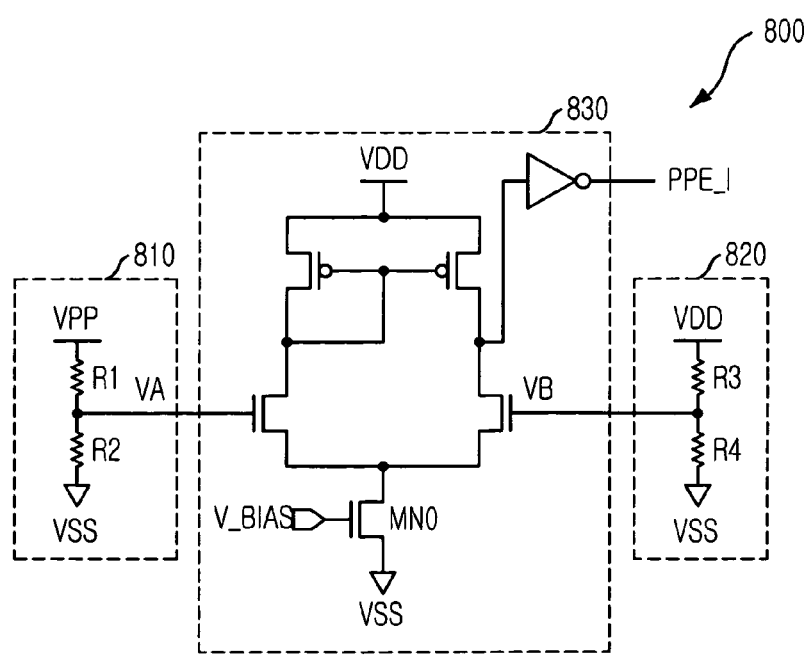
FIG. 6B is a schematic circuit diagram depicting the initial level sensor shown in FIG. 4 in accordance with a second embodiment of the present invention.

FIG. 6B is a schematic circuit diagram of the initial level sensor 800 shown in FIG. 4 in accordance with a second embodiment.

Referring to FIG. 6B, the initial level sensor 800 is provided with a first voltage divider 810 for dividing the upper voltage VPP, a second voltage divider 820 for dividing the power supply voltage VDD, and a differential sensor amplifier 830. Herein, the differential sensor amplifier 830 having output voltages VA and VB from the respective voltage dividers 810 and 820 is for outputting the initial level signal PPE_I when the level of the upper voltage VPP is lower than the level of the power supply voltage VDD.

The voltage dividers 810 and 820 are implemented with pairs of serially connected resistances R1 and R2, and R3 and R4, respectively. If a ratio of R1/R2 and a ratio of R3/R4 are the same, the initial level sensor 800 of FIG. 6B operates in a same way with the initial level sensor 800 shown in FIG. 6A.

Further, by controlling the ratios of the resistances R1/R2 and R3/R4, it is possible to adjust an operating range of the active charge pump 600 in accordance with the voltage difference between the upper voltage VPP and the power supply voltage VDD.

Figure 6C:
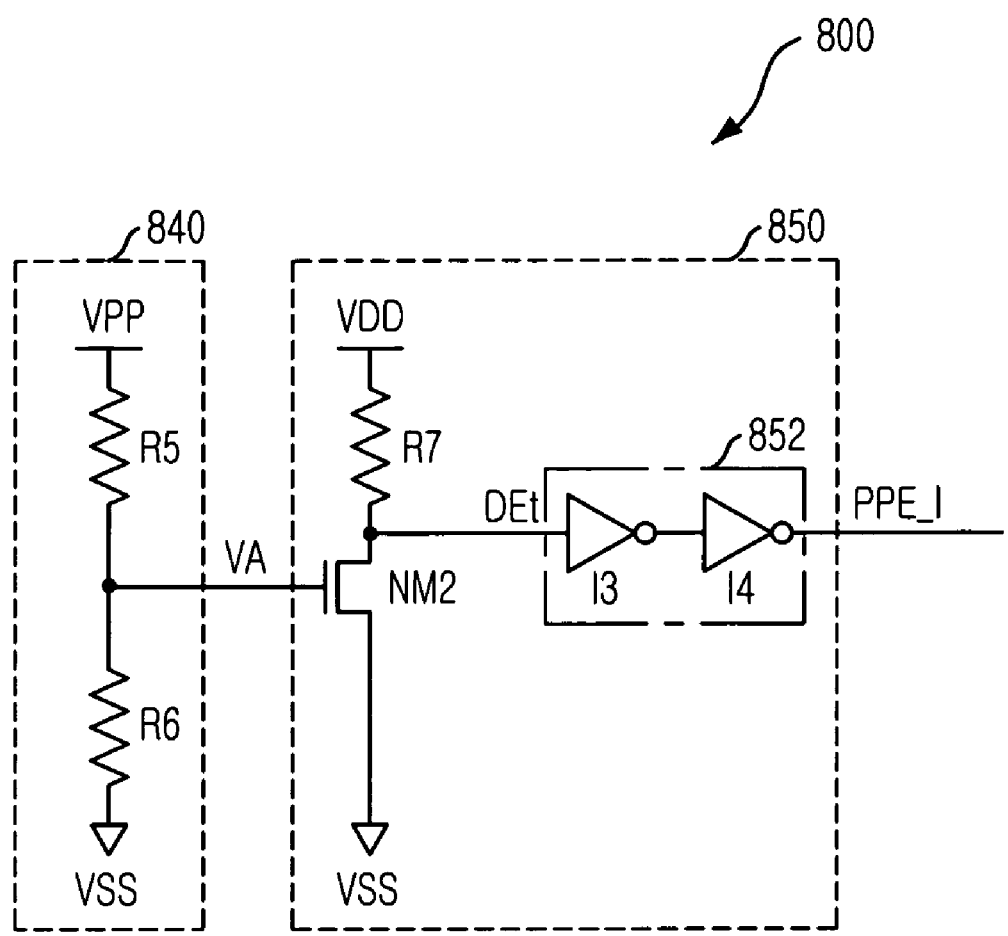
FIG. 6C is a schematic circuit diagram showing the initial level sensor shown in FIG. 4 in accordance with a third embodiment of the present invention.

FIG. 6C is a schematic circuit diagram of the initial level sensor 800 shown in FIG. 4 in accordance with a third embodiment.

Referring to FIG. 6C, the initial level sensor 800 is provided with a voltage follower 840 for outputting an output voltage Va being proportional to the level of the upper voltage VPP and a trigger 850 for outputting the initial level signal PPE_I in response to the output voltage Va outputted from the voltage follower 840.

Further, the voltage follower 840 includes a first resistance R5 and a second resistance R6 connected between the upper voltage VPP and a ground voltage VSS, wherein the resistances R5 and R6 are serially connected to each other. The voltage follower 840 outputs a voltage on the connection node of the first resistance R5 and the second resistance R6 as the output voltage Va.

The trigger 850 is provided with a NMOS transistor NM2, a resistance R7, and a buffer 852. The NMOS transistor NM2 receives the output voltage Va outputted from the voltage follower 840 through a gate and receives the ground voltage VSS through a source terminal. The resistance R7 exists between a drain terminal of the NMOS transistor NM2 and the power supply voltage VDD. The buffer 852 buffers a voltage of a drain terminal of the NMOS transistor NM2 and outputs it as the initial level signal PPE_I.

Hereinafter, the operation of the initial level sensor 800 in accordance with the third embodiment is explained.

First of all, the output voltage Va of the voltage follower 840 is R6/(R5+R6)×VPP being proportional to the upper voltage VPP.

When the level of the output voltage Va of the voltage follower 840 becomes higher than a threshold voltage of the NMOS transistor NM2, the NMOS transistor NM2 is turned-on and, a voltage level of the drain terminal of the NMOS transistor NM2 is determined based on an amount of a current passing through the resistor R7 and the NMOS transistor NM2.

In other words, in case that the level of the output voltage Va of the voltage follower 840 is higher than the threshold voltage of the NMOS transistor NM2, the level of the initial level signal PPE_I is changed from the logic level 'H' to the logic level 'L'.

Therefore, it is possible to adjust an operating range of the active charge pump 600 by properly controlling a resistance ratio of R5/R6 in the voltage follower 840 and the resistor R7 and the threshold voltage of the NMOS transistor NM2 in trigger 850.

As above mentioned, the internal voltage generator, including the initial level sensor in accordance with the first to third embodiment of the present invention, makes the upper voltage VPP rise rapidly in response to the rapid rising of the power supply voltage VDD by operating the active charge pump through the initial level sensor, when the level of the upper voltage VPP is lower than the level of the power supply voltage VDD.

The present application contains subject matter related to Korean patent application No. 2004-113621, filed in the Korean Patent Office on Dec. 28, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An internal voltage generator for use in a semiconductor memory device, comprising:
   a first pumping block for comparing an internal upper voltage with a reference voltage to generate a first compensated upper voltage based on a comparison result;
   an initial level sensing means for comparing the internal upper voltage with an operating voltage to thereby generate a first enable signal;
   a second pumping block for generating a second compensated upper voltage in response to an active command, the first enable signal, and the comparison result of the first pumping block; and
   an initializing means for providing the internal upper voltage during an initial operation of the semiconductor memory device.

2. The internal voltage generator as recited in claim 1, wherein the first pumping block includes:
   a level sensing means for comparing the internal upper voltage with the reference voltage;
   a first oscillation signal generating means for generating a first oscillation signal in response to an output signal of the level sensing means; and
   a first charge pumping means for generating the internal voltage by receiving the first oscillation signal and pumping an external voltage.

3. The internal voltage generator as recited in claim 2, wherein the second pumping block includes:
   an enable signal generating means for generating an active enable signal in response to the active command, the output signal of the level sensing means, and an output signal of the initial level sensing means;
   a second oscillation signal generating means for generating a second oscillation signal in response to the active enable signal; and
   a second charge pumping means for generating the internal voltage by receiving the second oscillation signal and pumping the external voltage.

4. The internal voltage generator as recited in claim 1, wherein the enable signal generating means activates the active enable signal in response- to the output signal of the level sensing means when the active command is supplied and activating the active enable signal in response to the initial level sensing means.

5. The internal voltage generator as recited in claim 4, wherein the initial level sensing means activates an initial level signal in case when the internal voltage is lower than the external voltage.

6. The internal voltage generator as recited in claim 5, wherein the initial level sensing means is implemented with a differential sensor amplifier having the internal voltage and the external voltage as differential inputs and for outputting the initial level signal.

7. The internal voltage generator as recited in claim 5, wherein the initial level sensing means includes:
   a first voltage dividing means for dividing the internal voltage;
   a second voltage dividing means for dividing the external voltage; and
   a differential sensor amplifier having output voltages of the first and second dividing means as differential inputs and for outputting the initial level signal.

8. The internal voltage generator as recited in claim 7, wherein the first voltage dividing means is implemented with a first resistor and a second resistor being serially connected each other between the internal voltage and a second internal voltage.

9. The internal voltage generator as recited in claim 7, wherein the second voltage dividing means is implemented with a first resistor and a second resistor being serially connected between the external voltage and a second internal voltage.

10. The internal voltage generator as recited in claim 5, wherein the initial level sensing means includes:
   a voltage following means for outputting an output voltage being proportional to the internal voltage; and
   a triggering means for sensing an output signal of the voltage following means and outputting the initial level signal.

11. The internal voltage generator as recited in claim 10, wherein the voltage following means includes a first resistor and a second resistor, being serially connected between the internal voltage and a second internal voltage, and outputs a voltage of a connection node of the first and second resistors as the output voltage.

12. The internal voltage generator as recited in claim 11, wherein the triggering means includes:

an NMOS transistor receiving the output voltage of the voltage following means through a gate and receiving the second internal voltage through a source terminal;
   a third resistor being placed between a drain terminal of the NMOS transistor and the external voltage; and
   a buffer for buffering a voltage of the drain terminal of the NMOS transistor and outputting the voltage as the initial level signal.

13. The internal voltage generator as recited in claim 5, wherein the enable signal generating means includes:
   a command generating means for receiving the active command and generating an internal active signal;
   a first output controlling means for outputting the internal active signal when the output signal of the level sensing means is activated; and
   a second output controlling means for activating the active enable signal in one of cases when an output signal of the first output controlling means is activated and when the output signal of the initial level sensing means is activated.

14. The internal voltage generator as recited in claim 13, wherein the first output controlling means includes:
   a NAND gate having the output signal of the level sensing means and an output signal of the command generating means as inputs; and
   a first inverter for inverting and outputting an output signal of the NAND gate.

15. The internal voltage generator as recited in claim 14, wherein the second output controlling means includes:
   a NOR gate having the output signal of the first controlling means and the output signal of the initial level sensing means as inputs; and
   a second inverter for inverting an output signal of the NOR gate and outputting the output signal as the active enable signal.

* * * * *